(12) United States Patent
Tyan et al.

(10) Patent No.: US 6,688,365 B2
(45) Date of Patent: Feb. 10, 2004

(54) METHOD FOR TRANSFERRING OF ORGANIC MATERIAL FROM A DONOR TO FORM A LAYER IN AN OLED DEVICE

(75) Inventors: Yuan-Sheng Tyan, Webster, NY (US); Giuseppe Farruggia, Webster, NY (US); Fridrich Vazan, Pittsford, NY (US); Thomas R. Cushman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 145 days.

(21) Appl. No.: 10/025,362

(22) Filed: Dec. 19, 2001

(65) Prior Publication Data

US 2003/0113656 A1 Jun. 19, 2003

(51) Int. Cl.[7] .......................... B44C 1/16; B32B 31/20; B32B 31/28; H01L 21/00; G03C 8/00
(52) U.S. Cl. ................. 156/540; 156/230; 156/379.6; 156/381; 156/382; 156/580; 118/50; 118/50.1; 427/457; 427/510; 427/148; 438/22; 430/200; 347/217
(58) Field of Search ................ 156/230, 234, 156/240, 247, 289, 272.7, 285, 379.6, 380.5, 381, 382, 540, 553, 580, 581, 583.1; 118/50, 50.1; 427/457, 492, 510, 472, 96, 162, 146, 147, 148; 428/195, 202, 914; 430/30, 200, 201; 438/22; 347/134, 217

(56) References Cited

U.S. PATENT DOCUMENTS

| | | | | |
|---|---|---|---|---|
| 4,314,814 A | * | 2/1982 | Deroode | 8/471 |
| 4,670,084 A | * | 6/1987 | Durand | 156/540 |
| 4,933,042 A | * | 6/1990 | Eichelberger et al. | 156/239 |
| 5,342,817 A | * | 8/1994 | Sarraf | 503/227 |
| 5,450,117 A | * | 9/1995 | Quanz | 347/217 |
| 5,578,416 A | | 11/1996 | Tutt | |
| 5,641,372 A | * | 6/1997 | Okuno | 156/230 |
| 5,742,129 A | | 4/1998 | Nagayama et al. | |
| 5,851,709 A | | 12/1998 | Grande et al. | |
| 5,937,272 A | | 8/1999 | Tang | |
| 5,972,780 A | * | 10/1999 | Machida et al. | 438/455 |
| 6,114,088 A | | 9/2000 | Wolk et al. | |
| 6,140,009 A | | 10/2000 | Wolk et al. | |
| 6,214,520 B1 | | 4/2001 | Wolk et al. | |

FOREIGN PATENT DOCUMENTS

EP        1 028 001        8/2000

* cited by examiner

*Primary Examiner*—J. A. Lorengo
(74) *Attorney, Agent, or Firm*—Raymond L. Owens

(57) ABSTRACT

A method for transferring organic material from a flexible donor element onto a substrate to form a layer of organic material in making one or more OLED devices, includes providing the flexible donor element and the substrate in a spaced relationship within a chamber under atmospheric pressure defined by a transfer station so that the flexible donor element partitions the chamber into first and second cavities; varying the pressure differential between the first and second cavities to cause the flexible donor element to move into a contact relationship with the substrate; providing a transparent window which defines the top surface of the second cavity; and providing radiation energy through the transparent window onto the flexible donor element in contact with the substrate to cause the flexible donor element to absorb heat and transfer organic material onto the substrate.

1 Claim, 3 Drawing Sheets

METHOD FOR TRANSFERRING OF ORGANIC MATERIAL FROM A DONOR TO FORM A LAYER IN AN OLED DEVICE

CROSS REFERENCE TO RELATED APPLICATION

Reference is made to commonly assigned U.S. patent application Ser. No. 10/021,410 filed Dec. 12, 2001 entitled "Method Using a Pressure Differential to Provide Uniform Contact Between a Donor and Substrate For Close Space Deposition" by Bradley A. Phillips et al., the disclosure of which are incorporated herein by reference.

FIELD OF THE INVENTION

The present invention relates to organic electroluminescent (EL) devices, also known as organic light-emitting devices (OLED), and particularly to methods and apparatus, which facilitate forming organic layers in such devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium may consist of one or more layers of organic thin films, where one of the layers is primarily responsible for light generation or electroluminescence. This particular layer is generally referred to as the emissive layer of the organic EL medium. Other organic layers present in the organic EL medium may provide electronic transport functions primarily and are referred to as either the hole transport layer (for hole transport) or electron transport layer (for electron transport). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow-mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of ±5 micrometers) for accurately forming EL devices.

A method for patterning high-resolution organic EL displays has been disclosed in U.S. Pat. No. 5,851,709 by Grande et al. This method is comprised of the following sequences of steps: 1) providing a substrate having opposing first and second surfaces; 2) forming a light-transmissive, heat-insulating layer over the first surface of the substrate; 3) forming a light-absorbing layer over the heat-insulating layer; 4) providing the substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate.

Alternatively, a method for transferring organic material from a donor sheet to a substrate using an unpatterned donor sheet and a precision light source, such as a laser, has been disclosed. A series of patents by Wolk et al. (U.S. Pat. Nos. 6,114,088; 6,140,009; 6,214,520; and 6,221,553) teaches a method that can transfer the luminescent layer of an EL device from a donor sheet to a substrate by heating selected portions of the donor with laser light.

In commonly assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material is deposited on a substrate in a selected pattern via the use of a donor coating on a support and an aperture mask. The aperture mask may be a separate entity between the donor layer and substrate (as in FIG. 1 in the aforementioned U.S. Pat. No. 5,937,272), or may be incorporated into the donor layer (as in FIGS. 4, 5, and 6 in the aforementioned U.S. Pat. No. 5,937,272).

The EL material transfer is preferably done in a reduced pressure environment between the donor and the substrate to ensure an uniform transfer of the materials from the donor and to minimize contamination of transferred materials. In addition, for maximizing the resolution in defining the area and the location of the materials transferred, the donor layer and substrate (and aperture, if separate) must be kept in close proximity. As an example, Tang shows an aperture or donor layer held close to or on a substrate surface.

A difficulty arises when both the low-pressure transfer environment requirement and the high-resolution transfer requirements are to be met.

In the case of Tang's teaching, the reduced pressure is achieved by placing both the donor and the substrate in a same vacuum chamber. While this method makes it easy to achieve the reduced pressure in the space between the donor and the substrate, it becomes difficult to maintain the intimate contact the method requires. Because a method of holding the donor to the substrate by introducing a vacuum between them cannot be used in a vacuum chamber, other methods need to be considered.

Isberg, et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive.

Mechanical pressure, such as that applied by a manual plate, can be used but is difficult to maintain evenly over the entire surface for the micrometer-order tolerances needed. Pressure from air or other fluids would work better, but the use of such pressure is made difficult in that the conditions in the vacuum chamber need to remain undisturbed.

Above cited, commonly assigned U.S. patent application Ser. No. 10/021,410 Phillips et al. provides an apparatus and a method to address the issue. This application teaches apparatus and methods to provide uniform and close contact between donor and substrate when both are pre-loaded in a vacuum chamber.

For ease of manufacturing, however, it is often preferable to handle the donor and the substrate under atmospheric pressure and provide the needed reduced-pressure condition only during the actual transfer process. In this case, a vacuum hold-down method is frequently used wherein the donor and the substrate are used to form parts of a vacuum chamber. When this vacuum chamber is evacuated, the atmospheric pressure outside the chamber pushes the donor and the substrate together. A difficulty arises in this situation in achieving truly low transfer pressure transfer environment, however. As soon as the pressure is beginning to be reduced, the donor and the substrate are pressed closely together and form a seal against further pumping of the spacing between them. The pressure in the spacing remains high and unpredictable, and may be inappropriate for high quality EL material transfer.

SUMMARY OF THE INVENTION

It is therefore an object of the present invention to provide an improved method to transfer organic material from a donor to a substrate. This object is accomplished by providing a method for transferring organic material from a flexible donor element onto a substrate to form a layer of organic material in making one or more OLED devices, comprising the steps of:

(a) providing the flexible donor element and the substrate in a spaced relationship within a chamber under atmospheric pressure defined by a transfer station so that the flexible donor element partitions the chamber into first and second cavities;

(b) varying the pressure differential between the first and second cavities to cause the flexible donor element to move into a contact relationship with the substrate;

(c) providing a transparent window which defines the top surface of the first cavity; and (d) providing radiation energy through the transparent window onto the flexible donor element in contact with the substrate to cause the flexible donor element to absorb heat and transfer organic material onto the substrate.

It is a further object of the present invention to provide an apparatus to facilitate the application of the method in the present invention.

An advantage to this method is that it allows the donor and the substrate to be handled mostly under atmospheric pressure conditions. It provides a reduced pressure during the actual transfer process, and a small spacing between the donor and the substrate to improve the resolution of the transferred patterns, and it accomplishes the transfer process at high throughput. A further advantage is that this method provides unimpeded optical path between the radiation source and the donor.

DETAILED DESCRIPTION OF THE INVENTION

Figure 1:
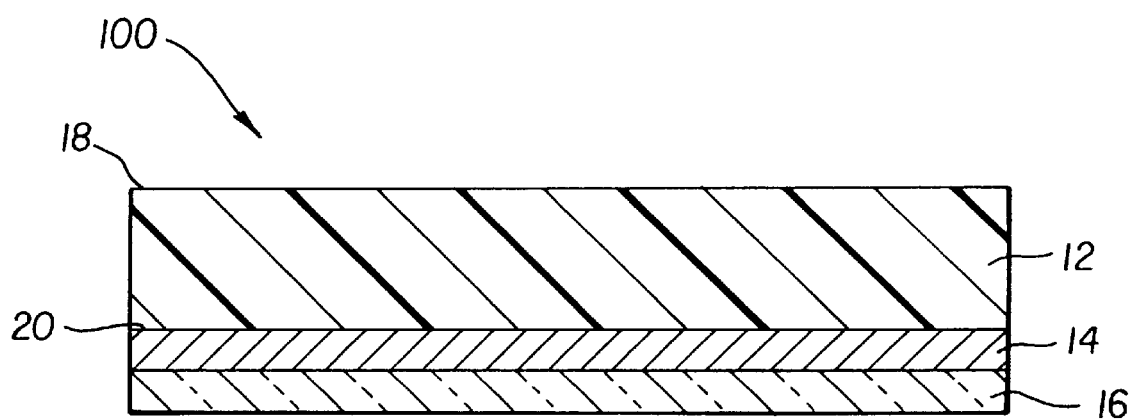
FIG. 1 is a cross-sectional representation of a donor that can be used with this invention.

Turning now to FIG. 1, there is shown a cross-sectional representation of flexible donor element 100 used for the organic materials transfer in accordance with the current invention. It includes support 12 that can be a flexible polymeric sheet. On one surface of the support 12 it is coated with radiation-absorbing material 14, then with organic material 16. This coated surface forms transfer surface 18, and the other surface of support 12 forms non-transfer surface 20. Radiation-absorbing material 14 is capable of absorbing radiation in a predetermined portion of the spectrum and producing heat. Radiation-absorbing material 14 can be a dye such as the dyes specified in U.S. Pat. No. 5,578,416, a pigment such as carbon, or a metal such as nickel, chromium, titanium, etc., or it can include a combination of materials in a single-layer or multiple-layer structure. Organic material 16 can be a hole-injecting material, a hole-transport material, an electron-transport material, an emissive material, a host material, or a combination of any of these materials.

Figure 2:
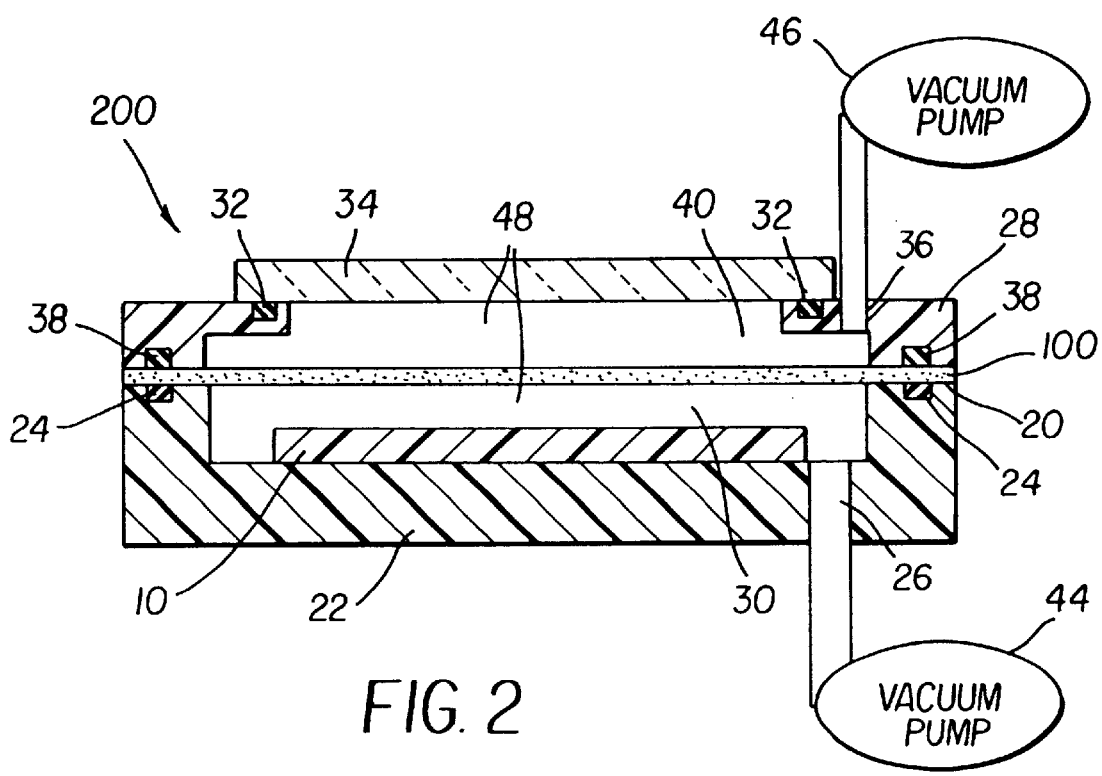
FIG. 2 is a cross-sectional representation of one embodiment of an apparatus designed in accordance with this invention in the pump-down configuration.

FIG. 2 is a schematic cross-sectional view of a transfer station apparatus 200 that can be used for the present invention. First fixture 22 is made of rigid materials. It provides mechanical support to flexible donor element 100 and substrate 10. First fixture 22 is provided with gasket 24, which fits into a slot that has been machined for it, that can provide a vacuum-tight seal with flexible donor element 100 when pressed against it, and pump port 26 which is connected to vacuum pump 46. Second fixture 28, also made of a rigid material, is provided with gasket 32 and gasket 38, each fits into a slot that has been machined for them, and pump port 36 that is connected to vacuum pump 44. Fixtures 22 and 28 define chamber 48. Vacuum pumps 44 and 46 can also be one single pump connected to pump port 26 and pump port 36 through individually controlled valves (not shown). Transparent window 34 is a rigid plate that is transparent to the radiation energy used for transferring organic material from flexible donor element 100 to substrate 10. Transparent window 34 is provided with means (not shown) to be held against second fixture 28 and pressed against gasket 32 to form a vacuum-tight seal with second fixture 28.

Flexible donor element 100 is placed between first fixture 22 and second fixture 28 and is held together with means (not shown) to form vacuum-tight seals between flexible donor element 100 and first fixture 22, and between flexible donor element 100 and second fixture 28. Flexible donor element 100 and first fixture 22 forms first cavity 30; flexible donor element 100, second fixture 28, and transparent window 34 forms second cavity 40. Substrate 10 is mounted against first fixture 22 in first cavity 30 with means not shown in the figure, and is facing transfer surface 18 of flexible donor element 100 in a relationship that allows the transfer of organic materials from flexible donor element 100 to substrate 10. The gap between flexible donor element 100 and substrate 10 is kept large to facilitate pumping to ensure that the reduced pressure needed for appropriate transfer of organic material can be quickly achieved.

FIG. 2 depicts the pump-down configuration of transfer station apparatus 200, where fixtures 22 or 28 have been moved to position, wherein flexible donor element 100 and substrate 10 have been properly loaded, cavities 30 and 40 have been formed, and evacuation of both cavities have begun. First cavity 30 is evacuated to achieve the desired transfer pressure. Second cavity 40 is evacuated to keep a small pressure differential between the two chambers to minimize the distortion of flexible donor element 100 in order to ensure that the gap between flexible donor element 100 and substrate 10 remains large. If flexible donor element 100 is pressed against substrate 10 prior to achieving the proper transfer pressure, the spacing between them will be reduced and the time to achieve proper transfer pressure will be increased. This is highly undesirable.

Figure 3:
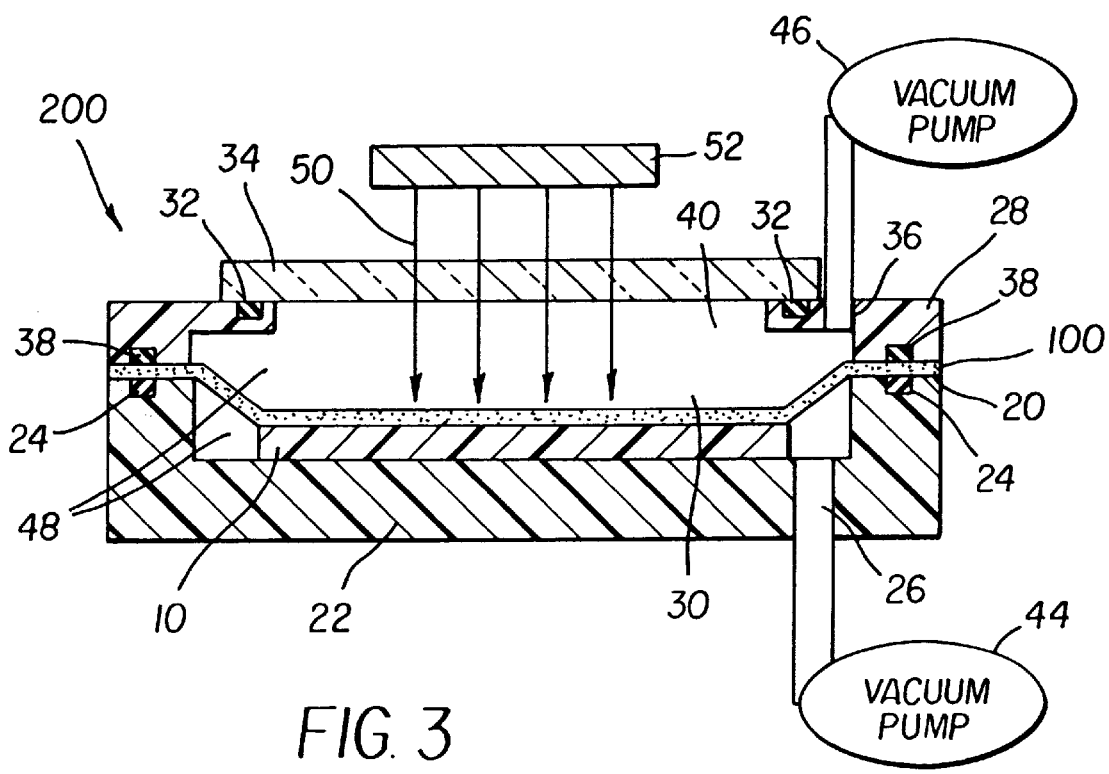
FIG. 3 is a cross-sectional representation of the aforementioned apparatus in transfer configuration.

FIG. 3 depicts the transfer configuration of transfer station apparatus 200. After the desired transfer pressure has been achieved, the pressure in second cavity 40 is increased. The increased pressure presses flexible donor element 100 into contact relationship with substrate 10. The term "contact relationship" means that the flexible donor element 100 flexible element engages the substrate 10 or spacer elements on the substrate 10. Alternatively, spacer elements such as beads can be formed on the flexible donor element 100. The actual gap spacing for transfer can be determined by the height of the standoffs on the substrate 10 or the flexible donor element 100. The small gap spacing is needed to achieve high-resolution transfer process. The radiation energy 50 is applied through transparent window 34, which is absorbed by the radiation-absorbing layer 14 to cause transfer of the organic materials from flexible donor element 100 to substrate 10.

The pressure increase in second cavity 40 can be accomplished by venting the chamber to atmosphere, or it can be accomplished by admitting a gas from a pressurized container. When the transfer process is completed, both first cavity 30 and second cavity 40 can be vented, the balance in pressure between first cavity 30 and second cavity 40 is again achieved, and the flexible donor element 100 springs back to essentially the original flatness. First fixture 22 and second fixture 28 can then be separated to remove the used flexible donor element 100 and substrate 10. New donor and substrate pieces can then be loaded to repeat the process.

It is noteworthy that the radiation energy 50 is applied through transparent window 34. Since cavity 40 has to be evacuated, transparent window 34 needs to withstand the atmospheric pressure from outside the cavity. Transparent window 34 needs to be strong and its thickness needs to be substantial. The larger the area of the substrate to be transferred, the thicker transparent window 34 needs to be. A thick element 34 increases the working distance between radiation source 52 and flexible donor element 100, which can be difficult to achieve with certain radiation sources. If a focused scanning beam source is used, the thick transparent window 34 will also makes focusing and scanning difficult due to possible aberration of the radiation energy beam. Furthermore, it is also difficult to make large, thick transparent elements 34 with acceptable optical perfection.

Figure 4:
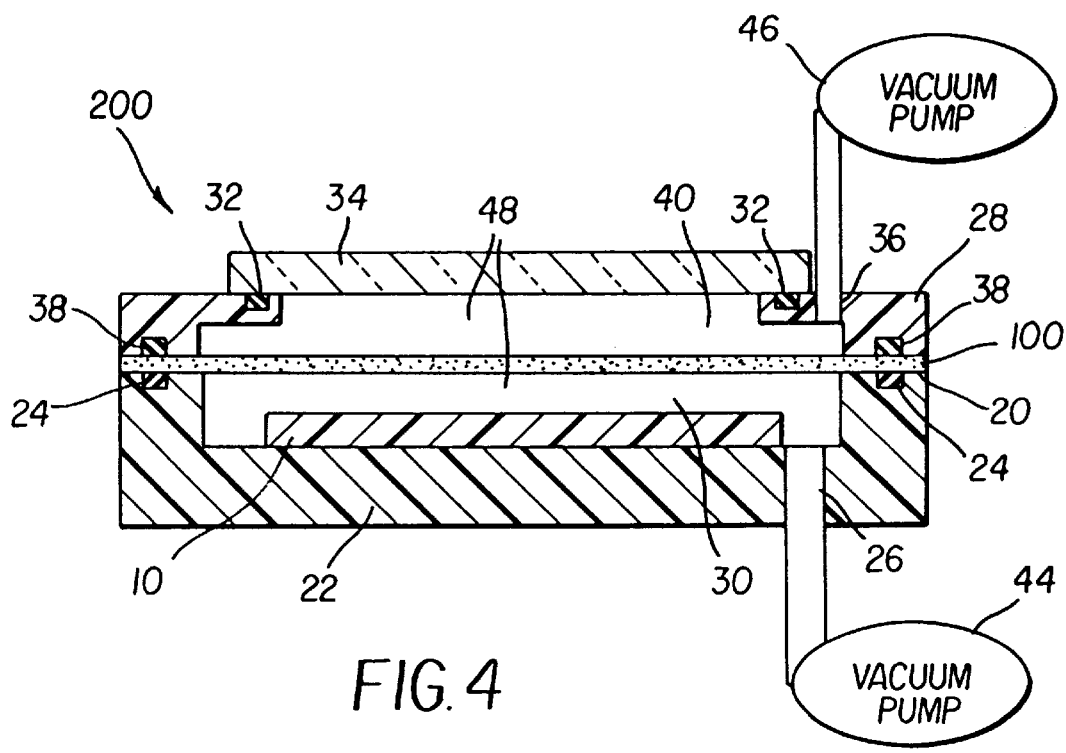
FIG. 4 is a cross-sectional representation of another embodiment of an apparatus designed in accordance with this invention in the pump-down configuration.
Figure 5:
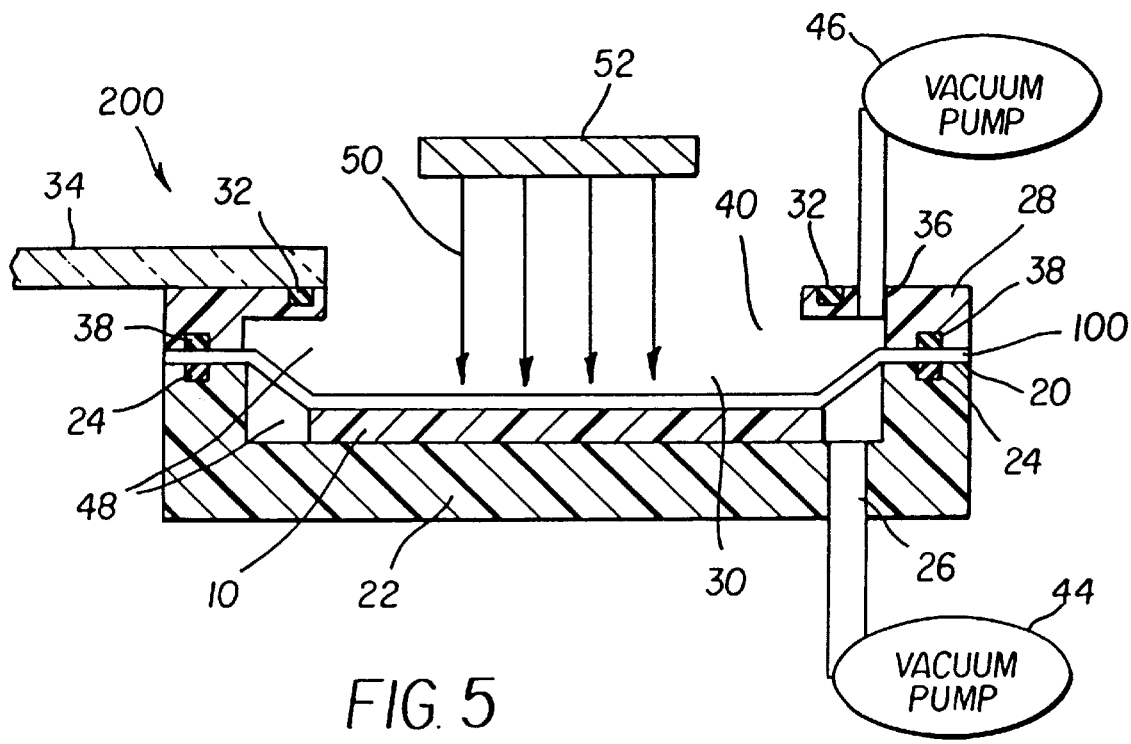
FIG. 5 is a cross-sectional representation of the aforementioned apparatus in transfer configuration.

FIG. 4 shows transfer station apparatus 300 depicting another embodiment designed according to the present invention. It is particularly suitable when large substrates are used. The transfer station apparatus 300 is shown in pump-down configuration. The operation of this transfer station apparatus 300 is essentially identical to that described above except transparent window 34 is replace by movable door 42. FIG. 5 shows this transfer station apparatus 300 in transfer configuration. After the transfer pressure has been achieved in first cavity 30 and after second cavity 40 has been vented to atmosphere, door 42 is opened exposing flexible donor element 100 to radiation energy source 52. This allows unimpeded access of flexible donor element 100 by the radiation energy beam 50. The working distance between the radiation energy source 52 and flexible donor element 100 can be reduced, and there is no longer aberration concerns. After the transfer process has been completed, first cavity 30 can be vented to allow separation of first fixture 22 and second fixture 28 and removal of the used flexible donor element 100 and substrate 10. Door 42 can then be re-closed to second fixture 28 to allow repeating of the procedure described above. In this embodiment, door 42 needs not be transparent to the radiation energy, which can simplify the construction of the apparatus.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 12 | donor |
| 14 | radiation absorbing layer |
| 16 | organic material |
| 18 | transfer surface |
| 20 | non-transfer surface |
| 22 | first fixture |
| 24 | gasket |
| 26 | pump port |
| 28 | second fixture |
| 30 | first cavity |
| 32 | gasket |
| 34 | transparent window |
| 36 | pump port |
| 38 | gasket |
| 40 | second cavity |
| 42 | door |
| 44 | vacuum pump |
| 46 | vacuum pump |
| 48 | chamber |
| 50 | radiation energy |
| 52 | radiation energy source |
| 100 | flexible donor element |
| 200 | transfer station apparatus |
| 300 | transfer station apparatus |

What is claimed is:

1. Apparatus for transferring organic material from a flexible donor element onto a substrate to form a layer of organic material in making one or more OLED devices, comprising:

(a) first and second fixtures and means to move the first and second fixtures into engagement to define a transfer station having a chamber, the second fixture including a door element which defines a portion of the chamber and is movable from a closed to an open radiation receiving position;

(b) means to provide the flexible donor element and the substrate in a spaced relationship within the chamber under atmospheric pressure so that the flexible donor element partitions the chamber into first and second cavities;

(c) means to reduce the pressure in the first and second cavities while minimizing distortion of the flexible donor element;

(d) means to increase the pressure in the second cavity to cause the flexible donor element to move into a contact relationship with the substrate and to move the door element to the open radiation receiving position;

(e) means to provide radiation energy through the open radiation receiving position in the second fixture onto the flexible donor element in contact with the substrate to cause the flexible donor element to absorb heat and transfer organic material onto the substrate.

* * * * *

UNITED STATES PATENT AND TRADEMARK OFFICE
CERTIFICATE OF CORRECTION

PATENT NO. : 6,688,365 B2
DATED : February 10, 2004
INVENTOR(S) : Yuan-Sheng Tyan et al.

It is certified that error appears in the above-identified patent and that said Letters Patent is hereby corrected as shown below:

Column 6,
Lines 46 and 59, "door" should read -- donor --

Signed and Sealed this

Twenty-ninth Day of June, 2004

JON W. DUDAS
*Acting Director of the United States Patent and Trademark Office*